(12) United States Patent
Chun

(10) Patent No.: US 7,719,916 B2
(45) Date of Patent: May 18, 2010

(54) SEMICONDUCTOR MEMORY DEVICE

(75) Inventor: Jun-Hyun Chun, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 306 days.

(21) Appl. No.: 12/003,685

(22) Filed: Dec. 31, 2007

(65) Prior Publication Data
US 2008/0239853 A1 Oct. 2, 2008

(30) Foreign Application Priority Data
Mar. 29, 2007 (KR) .................. 10-2007-0030731

(51) Int. Cl.
*G11C 7/00* (2006.01)
(52) U.S. Cl. .................. 365/222; 365/230.06; 365/233; 365/236
(58) Field of Classification Search .............. 365/222, 365/230.06, 233, 236
See application file for complete search history.

(56) References Cited

U.S. PATENT DOCUMENTS

| | | | | |
|---|---|---|---|---|
| 5,796,669 | A | * | 8/1998 | Araki et al. .................. 365/222 |
| 6,055,615 | A | * | 4/2000 | Okajima ..................... 711/169 |
| 7,038,968 | B2 | | 5/2006 | Kim |
| 7,082,063 | B2 | * | 7/2006 | Yahata et al. ............... 365/193 |
| 2005/0105352 | A1 | | 5/2005 | Lee |
| 2005/0228611 | A1 | | 10/2005 | Kim |
| 2006/0066386 | A1 | | 3/2006 | Hong |
| 2006/0087901 | A1 | | 4/2006 | Hong et al. |

FOREIGN PATENT DOCUMENTS

| | | |
|---|---|---|
| JP | 2005-216429 | 8/2005 |
| JP | 2005-327382 | 11/2005 |
| JP | 2006-004558 | 1/2006 |
| KR | 10-2001-0112760 A | 12/2001 |
| KR | 10-2003-0009125 A | 1/2003 |
| KR | 10-2005-0104807 A | 11/2005 |
| KR | 10-2005-0109042 A | 11/2005 |

OTHER PUBLICATIONS

Korean Notice of Allowance issued in Korean Patent Application No. KR 10-2007-0030731, dated Aug. 13, 2008.

* cited by examiner

*Primary Examiner*—Son Dinh
(74) *Attorney, Agent, or Firm*—IP & T Law Firm PLC

(57) ABSTRACT

A semiconductor memory device includes a command decoder, a refresh address counter, an address delivery unit, and an address output selector. The command decoder decodes a command signal to generate a refresh signal. The refresh address counter generates a refresh address in response to the refresh signal. The address delivery unit delivers one of the refresh address and an address from outside of the semiconductor memory device to a memory core area. The address output selector outputs the refresh address to the outside of the semiconductor memory device.

12 Claims, 7 Drawing Sheets

# SEMICONDUCTOR MEMORY DEVICE

CROSS-REFERENCE TO RELATED APPLICATION

The present invention claims priority of Korean patent application number 10-2007-0030731, filed on Mar. 29, 2007, which is incorporated by reference in its entirety.

BACKGROUND OF THE INVENTION

The present invention relates to a semiconductor memory device; and, more particularly, to a refresh operation of a semiconductor memory device.

Generally, a semiconductor memory device is a semiconductor device for storing a great amount of data. This semiconductor memory device is divided into a data storage area for storing data and a peripheral and input/output area for accessing the data stored in the data storage area. The data storage area is provided with a plurality of unit cells, each of which stores a single datum. The peripheral and input/output area is provided with a variety of circuits for effectively accessing data of the unit cells in the data storage area.

A dynamic random access memory (DRAM), a most widely used semiconductor memory device, is designed in a manner that one unit cell is implemented with a single MOS transistor and a single capacitor. In order to store more data, the MOS transistor and capacitor constituting each of the unit cells in the data storage area are manufactured in as small a size as possible.

Since a semiconductor memory device, such as a DRAM, uses a capacitor as a basic component of data storage, the data stored therein should be refreshed at regular intervals. This is because the charge amount stored in the capacitor gets lost as time goes by, in view of the nature of the capacitor. The semiconductor memory device performs the operation of supplementing the lost amount of charge before the charge amount stored in the capacitor constituting the unit cell decreases less than a predetermined amount. This operation is called a refresh operation.

The refresh operation includes an auto refresh operation and a self refresh operation. The auto refresh operation refers to an operation that takes a refresh command from outside of the semiconductor memory device, internally generates an address to be refreshed, and then performs the refresh operation during the data access of the semiconductor memory device. The self refresh operation refers to an operation that accepts a start command related to the self refresh from the outside of the semiconductor memory device, internally generates a refresh command and an address to be refreshed, and then executes the refresh operation when the semiconductor memory device is not performing a data access operation, such as a power down mode and the like.

In order to know if the self refresh or auto refresh operation is being properly performed at predetermined intervals, it is required to check whether there is any change by data access after the refresh operation is finished. However, this method accesses stored data whenever the refresh operation is finished, which uses much test time and there is no way of knowing where problems, if any, occur during the refresh operation.

FIG. 1 is a waveform view describing a self refresh operation of a semiconductor memory device.

First, with a test mode signal TM1 being enabled, when the memory device enters a self refresh mode by a command EXTERNAL COMMAND inputted from outside of the semiconductor memory device, a refresh timer provided therein generates a refresh enable signal OSC every preset period. The refresh operation is carried out whenever the refresh enable signal OSC gets activated. At this time, a clock enable signal CKE is at a logic low level, which is in a deactivation state. An internal clock is internally generated by buffering a system clock CLK provided from the outside. The internal clock is inputted to a counter provided in the semiconductor memory device, wherein the counter counts the internal clock. Meanwhile, when the refresh enable signal OSC gets in an activation state, control signals 01 and 02 of pulse shape are produced at a rising edge of the refresh enable signal OSC. The control signal 01 is used to latch a value counted in the counter and the control signal 02 is used to initialize the counter.

The value counted in the counter is latched in a register R/G until the refresh enable signal OSC is activated again, and then outputted to the outside through an input/output line I/O and a data output buffer DQ. In this manner, it is possible to know the refresh state at the outside by providing the counted valued stored in the register to the outside whenever the refresh enable signal OSC is activated. As shown in FIG. 1, after the refresh enable signal OSC is activated, the value 2710 counted in the counter is outputted to the outside when the next refresh enable signal OSC is activated.

However, even though it is possible to know whether the refresh operation is performed by outputting the counted value when the refresh operation is made, it is difficult to know the accurate refresh period and the exact location where the refresh operation is performed. This happens because the counted value can be outputted to the outside whenever the refresh operation is performed.

SUMMARY OF THE INVENTION

Embodiments of the present invention are directed to provide a semiconductor memory device for measuring a self refresh period by checking a row address where a self refresh operation is performed.

In accordance with an aspect of the present invention, there is provided a semiconductor memory device including a command decoder, a refresh address counter, an address delivery unit, and an address output selector. The command decoder decodes a command signal to generate a refresh signal. The refresh address counter generates a refresh address in response to the refresh signal. The address delivery unit delivers one of the refresh address and an address from outside of the semiconductor memory device to a memory core area. The address output selector outputs the refresh address to the outside of the semiconductor memory device.

In accordance with another aspect of the present invention, there is provided a semiconductor memory device including a memory core area, an address counter, a data access controller, an address output selector, and a data output circuit. The address counter generates a refresh address. The data access controller receives data from the memory core area and transfers the same in response to a refresh signal for test. The address output selector transfers the refresh address or data from the data access controller in response to the refresh signal for test. The data output circuit outputs one of the refresh address and data provided from the address output selector to outside of the semiconductor memory device.

In accordance with still another aspect of the present invention, there is provided a driving method of a semiconductor memory device including generating a refresh address in response to the refresh signal and outputting the refresh address to outside of the semiconductor memory device through a data output path.

DETAILED DESCRIPTION OF THE INVENTION

Hereinafter, preferred embodiments of the present invention will be described in detail with reference to the accompanying drawings so that the invention can be easily carried out by those skilled in the art.

Figure 1:
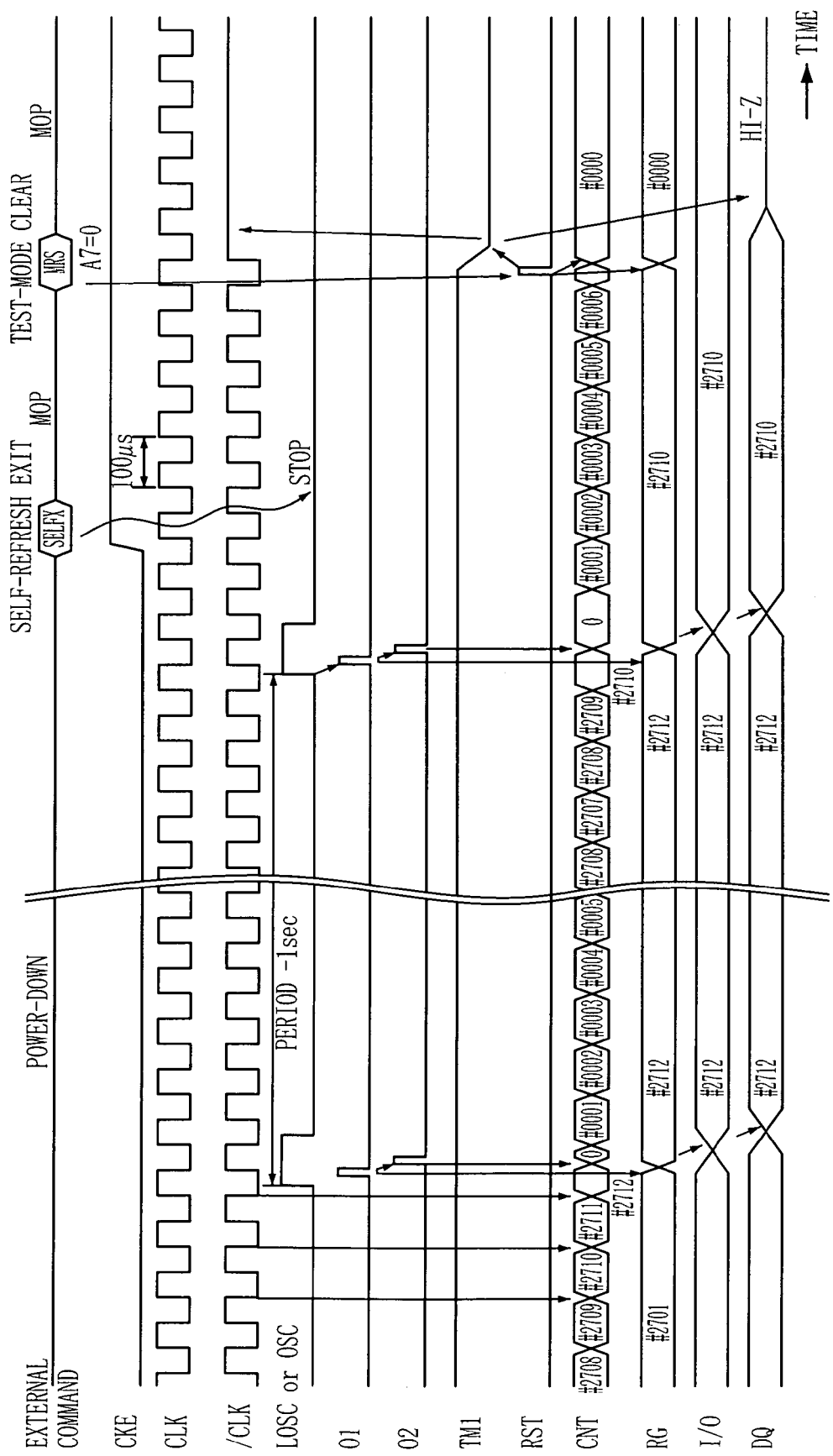
FIG. 1 is a waveform diagram describing a self refresh operation of a semiconductor memory device.
Figure 2:
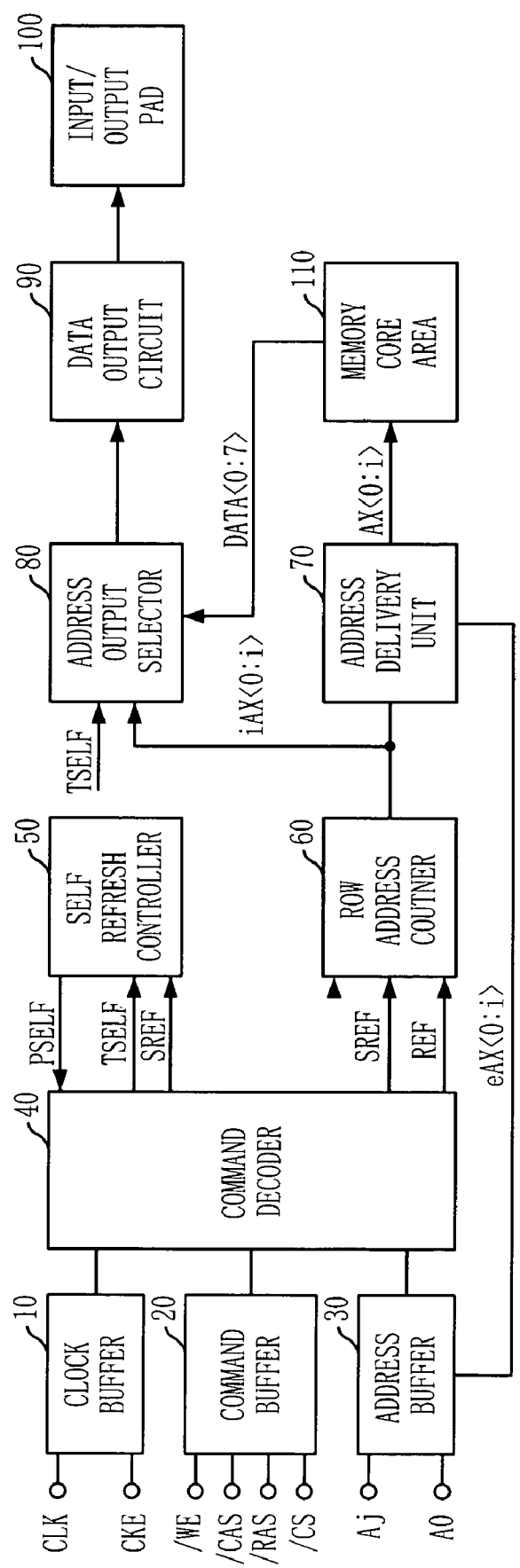
FIG. 2 is a block diagram illustrating a semiconductor memory device in accordance with a preferred embodiment of the present invention.

FIG. 2 is a block diagram illustrating a semiconductor memory device in accordance with a preferred embodiment of the present invention.

Referring to FIG. 2, the semiconductor memory device in accordance with the present invention includes a clock buffer 10, a command buffer 20, an address buffer 30, a command decoder 40, a self refresh controller 50, a row address counter 60, an address delivery unit 70, an address output selector 80, a data output circuit 90, and an input/output pad 100. The clock buffer 10 is activated in response to a clock enable signal CKE, and receives and buffers a clock signal CLK to generate an internal clock. The command buffer 20 takes and buffers command signals /WE, /CAS, /RAS, and /CS and delivers them to the command decoder 40. The address buffer 30 takes and buffers address signals Aj to Ao and transfers them to the command decoder 40. The command decoder 40 accepts and decodes the command signals from the command buffer 20 to generate a control signal (not shown) for data access and control signals TSELF, SREF, and REF for refresh operation. The self refresh test signal TSELF is a signal for controlling self refresh in a test mode. The self refresh signal SREF is a signal that is activated in a self refresh mode. And, the refresh signal REF is a signal for controlling the refresh operation in the self refresh or auto refresh mode.

The self refresh controller 50 receives the self refresh test signal TSELF and the self refresh signal SREF and generates a self refresh drive signal PSELF. The command decoder 40 generates the refresh signal REF in response to the self refresh drive signal PSELF. The row address counter 60 is reset in response to the self refresh signal SREF and counts the refresh signal REF to output a counted value. The address delivery unit 70 delivers an address eAX<0:i> provided from the address buffer 30 or delivers an address iAX<0:i> from the row address counter 60 to a memory core area 110. The address output selector 80 transfers data DATA<0:7> from the memory core area 110 or transfers the row address iAX<0:i> for self refresh from the row address counter 60 in response to the self refresh test signal TSELF. The data output circuit 90 outputs data from the address output selector 80 to the outside of the semiconductor memory device through the input/output pad 100.

The greatest feature of the semiconductor memory device in accordance with the present invention is that the row address that performs the refresh in the self refresh mode can be outputted to the outside. For this, the row address counter 60 and the address output selector 80 are provided therein.

During the data access, the address delivery unit delivers the address delivered through the address buffer 30 to the memory core area 110, and the data outputted from the memory core area is outputted to the outside through the address output selector and the data output circuit. Meanwhile, during the self refresh for test, the row address for self refresh provided from the row address counter is outputted to the outside through the address output selector 80 and the data output circuit 90.

Therefore, while the semiconductor memory device is in process of the self refresh mode for test, it is possible to easily know a word line that in process of refresh at the outside, and to easily calculate a self refresh period by using the row address for the self refresh being outputted. That is, by detecting the self fresh row address outputted in the self refresh mode for test, timing when the self refresh is made by word lines can be readily recognized.

Figure 3:
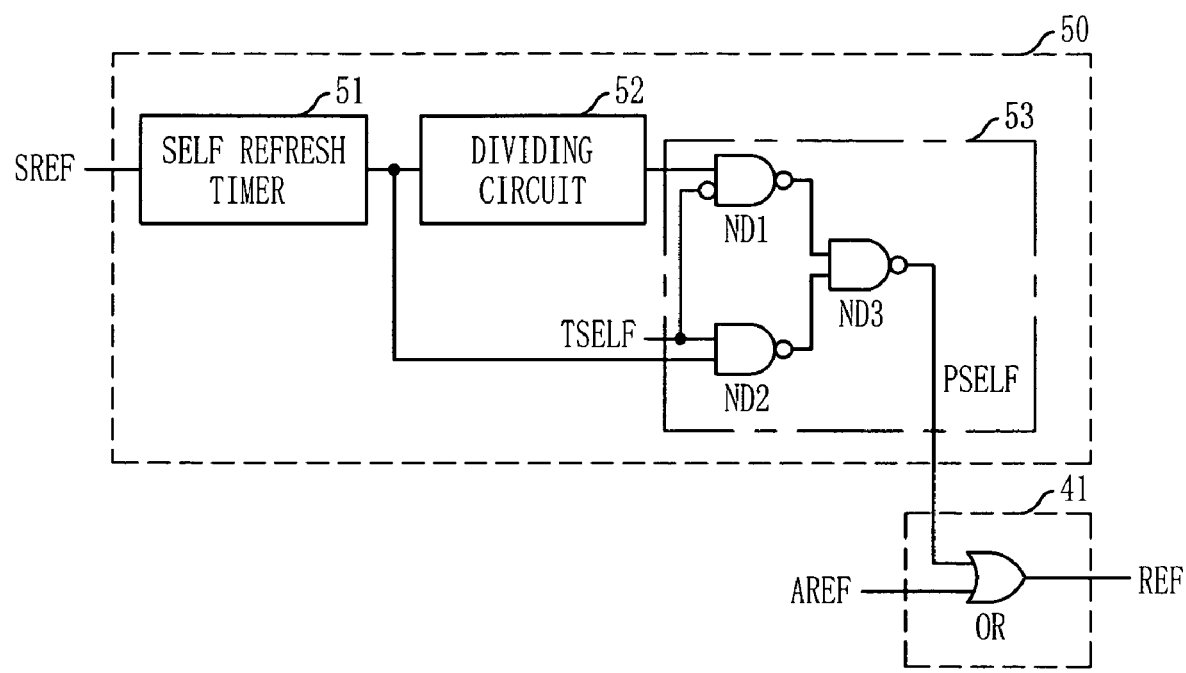
FIG. 3 is a detailed circuit diagram of the self refresh controller shown in FIG. 2.

FIG. 3 is a detailed circuit diagram of the self refresh controller 50 shown in FIG. 2.

Referring to FIG. 3, the self refresh controller 50 is provided with a self refresh timer 51, a dividing circuit 52, and a signal selector 53. The self refresh timer 51 takes a self refresh signal SREF to generate a signal being activated for every preset self refresh period. The dividing circuit 52 divides the signal from the self refresh timer 51 to output a divided signal. The signal selector 53 outputs the signal from the self refresh timer 51 or the signal from the dividing circuit 52 as a self refresh drive signal PSELF in response to the self refresh test signal TSELF. An auto refresh signal AREF used herein is a signal generated inside the command decoder 40, and a signal combiner 41 is also a circuit arranged inside the command decoder 40.

Although the output of the self refresh timer 51 is generated as the self refresh drive signal PSELF in response to the self refresh test signal TSELF, it may be implemented in a manner that the output of the dividing circuit is generated as the self refresh drive signal PSELF in response to the self refresh test signal TSELF.

Figure 4:
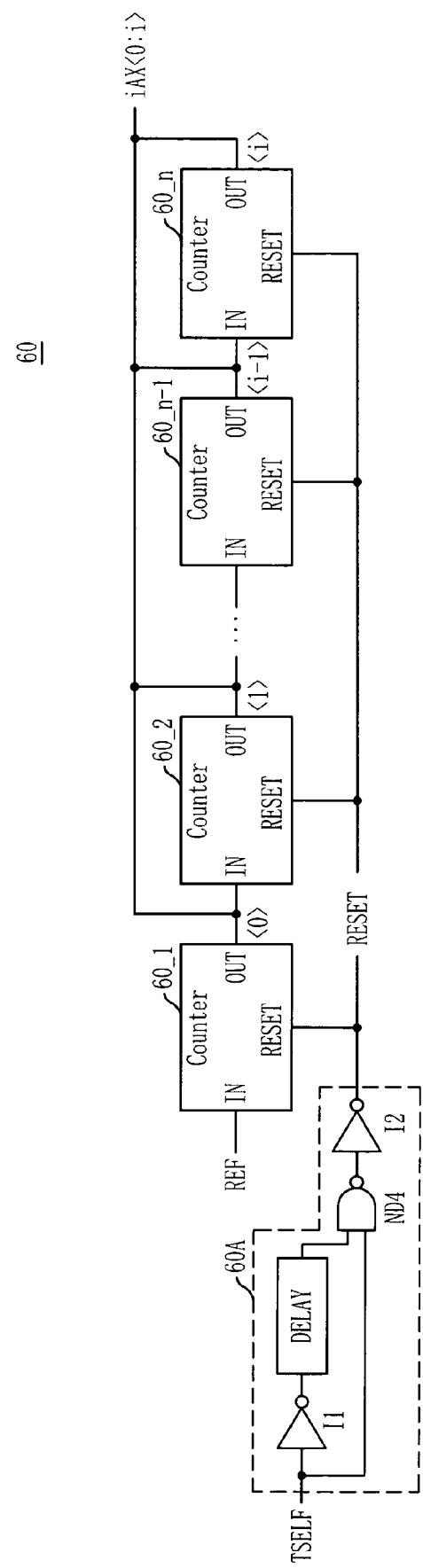
FIG. 4 is a detailed circuit diagram of the row address counter shown in FIG. 2.

FIG. 4 is a detailed circuit diagram of the row address counter 60 shown in FIG. 2.

Referring to FIG. 4, the row address counter 60 is provided with a reset signal generator 60A for generating a reset signal RESET in response to the self refresh test signal TSELF, and counters 60_1 to 60_n connected in series for counting the refresh signal REF.

Figure 5:
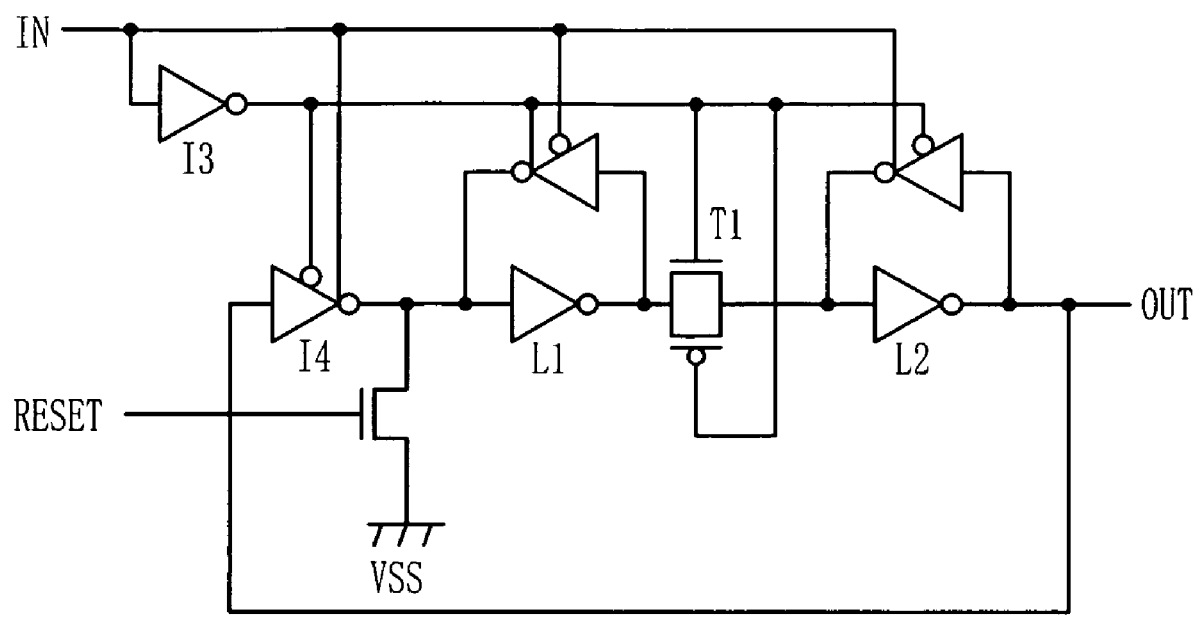
FIG. 5 is a detailed circuit diagram of the counter shown in FIG. 4.

FIG. 5 illustrates a detailed circuit diagram of the counter 60_1 that is one of the counters shown in FIG. 4.

Referring to FIG. 5, the counter 60_1 is provided with latches L1 and L2 for latching an input signal in response to the signal, a transfer gate T1 arranged between the two latches, inverters I3 and I4, and a MOS transistor T2 for taking a reset signal RESET and outputting a logic low signal as an output signal OUT. The counter 60_1 transits the output signal OUT to a logic low level or logic high level whenever the input signal IN is transited, and produces the output signal OUT of logic low level unconditionally upon input of the reset signal RESET.

Figure 6:
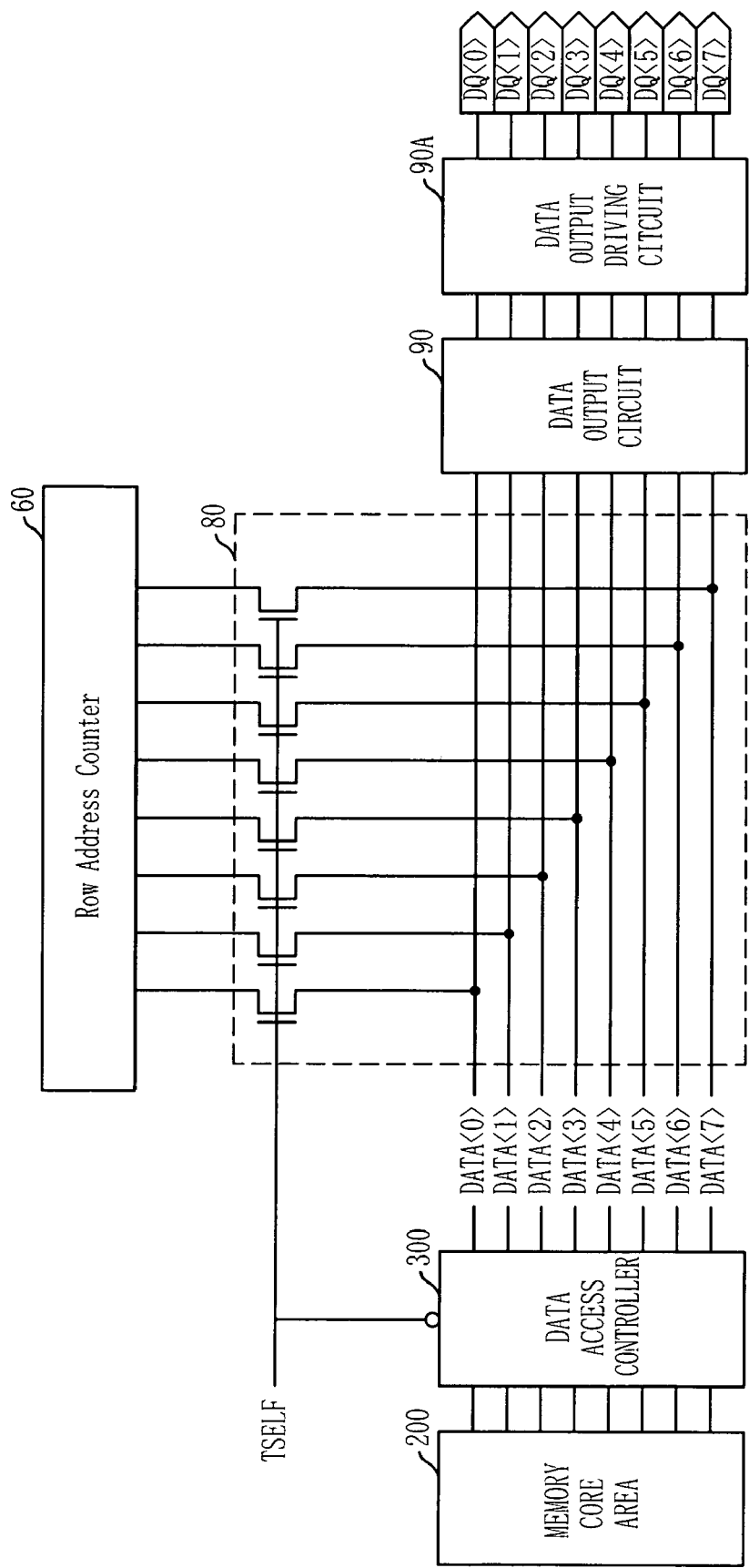
FIG. 6 is a block diagram showing a data transfer path of the semiconductor memory device in accordance with the present invention.

FIG. 6 is a block diagram illustrating a data transfer path of the semiconductor memory device in accordance with the present invention.

As shown in FIG. 6, since the self refresh test signal TSELF is in a disable state as a logic low level during the data access, MOS transistors TS1 to TS8 constituting the address output selector 80 depicted in FIG. 2 are all in a turn-off state. Data from a memory core area 200 are outputted to the outside through a data access controller 300 via a data output circuit 90 and a data output driver 90A. Meanwhile, the self refresh test signal TSELF gets a logic high level in the self refresh mode for test, so the MOS transistors TS1 to TS8 constituting the row address output selector 80 are turned on and the data access controller 300 is in a deactivation state.

Thus, the row address counted to perform the self refresh operation in the row address counter 60 is delivered to the data output circuit 90 through the MOS transistors TS1 to TS8 of the row address output selector 80. The row address delivered to the data output circuit 90 is outputted to the outside via the data output driver 90A.

Figure 7:
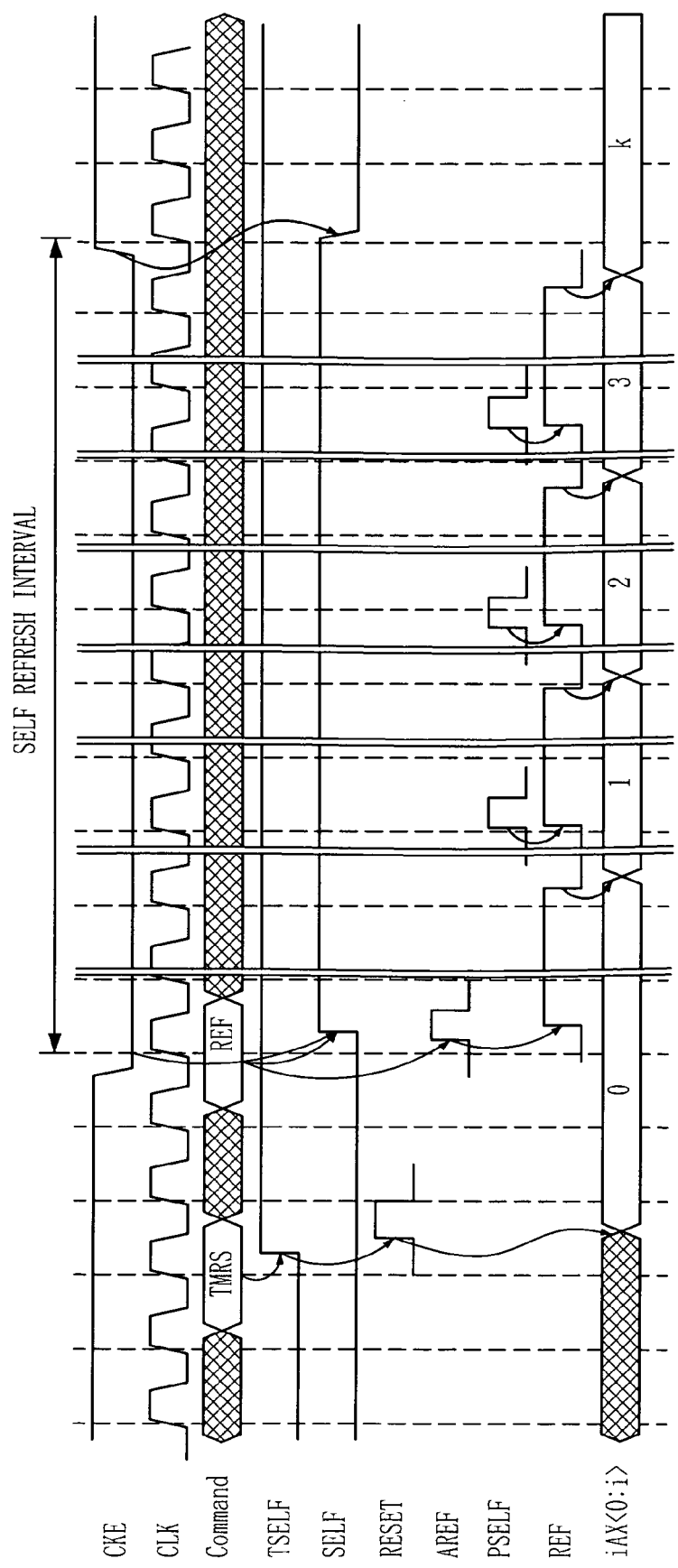
FIG. 7 is a waveform diagram describing the operation of the semiconductor memory device shown in FIG. 2.

FIG. 7 is a waveform diagram describing the operation of the semiconductor memory device shown in FIG. 2.

As shown in FIG. 7, an interval where the clock enable signal CKE is at a logic low level with the self refresh test signal TSELF being activated is an interval where the self refresh operation is performed. In response to logic high level transition of the self refresh test signal TSELF, the reset signal RESET is generated and thus the signals iAX<0:i> from the row address counter 60 are all reset. The command decoder 40 activates the self refresh signal SELF to a logic high level in synchronism with timing the clock enable signal CKE is transited to a logic low level, and generates an auto refresh signal AREF. The auto refresh signal AREF is a signal, which is generated upon execution of the auto refresh operation, and is issued once at the time the self refresh signal SELF is transited to a logic high level upon execution of the self refresh operation and used for the command decoder 40 to generate the refresh signal REF. After that, in response to the self refresh drive signal PSELF generated for every preset period in the self refresh controller 50, the command decoder 40 generates the refresh signal REF. The refresh signal REF is used for the row address counter 60 to count the row address for self refresh.

The row address for self refresh counted in response to the transition of the refresh signal REF in the row address counter 60 is used for self refresh operation, while being outputted to the outside through the address output selector 80 and the data output circuit 90.

At this time, using the row address for self refresh operation outputted to the outside can easily calculate an average value of the self refresh period. Further, it is possible to easily find a word line that is currently in process of self refresh, thereby enabling various analyses about the self refresh operation.

The self refresh period may be calculated as follows:

$$t\text{self\_period} = \text{SELF duration}/(k-1) \quad \text{Eq. (1)}$$

wherein the SELF duration is a self refresh operation maintenance time arbitrarily set in the test mode and k is a value having the row address for self refresh operation converted into decimal numeral.

For example, if the self refresh operation maintenance time is 10 ms and k is 1001, the self refresh period gets 10 μs.

In another embodiment of the present invention, the row address counter 60 may count the row address by using the self refresh operation signal PSELF of pulse shape generated by the self refresh controller 50, rather than by using the refresh signal REF.

Moreover, the row address for refresh may be outputted to the outside, as in the embodiment of the present invention, even in the auto refresh operation mode, rather than the self refresh mode, and the auto refresh operation test may be conducted by using the row address.

As described above, the present invention can easily measure a period of self refresh operation. In the conventional method, it was possible to know that the self refresh operation is performed only by using the output of a clock counter, but it was difficult to measure the self refresh period. However, the present invention can easily measure the self refresh period because it is possible to check a row address where the self refresh operation is performed directly at the outside.

In addition, since the present invention is able to measure the row address for the self refresh at the outside, it is possible to easily know a word line that is in the process of self refresh operation in the self refresh operation interval. Thus, when an error occurs upon data access after the self refresh operation is finished, it is possible to easily know whether the error is caused by the self refresh operation or by other data access operations.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a command decoder for decoding a command signal to generate a refresh signal;
   a refresh address counter for generating a refresh address in response to the refresh signal;
   an address delivery unit for delivering one of the refresh address and an address from outside of the semiconductor memory device to a memory core area; and
   an address output selector for outputting the refresh address to the outside of the semiconductor memory device.

2. The semiconductor memory device of claim 1, further comprising a data output circuit for transferring the refresh address provided from the address output selector to a data input/output pad, wherein the address output selector transfers the refresh address delivered from the address output selector in a self refresh mode for test to the data output circuit.

3. The semiconductor memory device of claim 1, further comprising:
   a clock buffer for taking a clock signal and delivering the same to the command decoder in response to a clock enable signal;
   a command buffer for buffering command signals and delivering the same to the command decoder; and
   an address buffer for buffering addresses and delivering the same to the address delivery unit.

4. The semiconductor memory device of claim 1, wherein the refresh signal is activated during a self refresh interval.

5. The semiconductor memory device of claim 4, further comprising a self refresh controller for generating a self refresh operation signal every preset self refresh period and delivering the same to the command decoder so that the command decoder periodically generates a refresh signal, wherein the command decoder generates the refresh signal in response to the self refresh operation signal.

6. The semiconductor memory device of claim 5, wherein the self refresh controller includes:
   a self refresh timer, activated in response to a self refresh activation signal provided from the command decoder, for generating an interval pulse every preset interval; and a signal selector for outputting the interval pulse as the self refresh operation signal in response to the self refresh activation signal for test provided from the command decoder.

7. The semiconductor memory device of claim 6, wherein the refresh address counter includes:
   a reset signal generator for accepting the self refresh activation signal for test to generate a rest signal; and
   a plurality of counters connected in series for taking the refresh signal and sequentially counting the address to output a counted value, the plurality counters resetting an output signal in response to the reset signal.

8. A semiconductor memory device, comprising:
   a memory core area;
   an address counter for generating a refresh address;
   a data access controller for receiving data from the memory core area and transferring the same in response to a refresh signal for test;
   an address output selector for transferring the refresh address or data from the data access controller in response to the refresh signal for test; and
   a data output circuit for outputting one of the refresh address and data provided from the address output selector to outside of the semiconductor memory device.

9. The semiconductor memory device of claim 8, wherein the address counter includes:
   a reset signal generator for accepting the refresh signal for test to generate a rest signal; and
   a plurality of counters coupled in series for taking the refresh signal for test activated every preset period in a refresh interval and sequentially counting the refresh address to output a counted value, the plurality of counters resetting an output signal in response to the reset signal.

10. The semiconductor memory device of claim 9, wherein the refresh signal for test is activated during a self refresh interval.

11. A driving method of a semiconductor memory device, comprising the steps of:
    decoding a command signal to generate a refresh signal;
    generating a refresh address in response to the refresh signal; and
    outputting the refresh address to outside of the semiconductor memory device through a data output path.

12. The driving method of claim 11, wherein the refresh signal is activated during a self refresh interval.

* * * * *